(12) United States Patent
Jeon et al.

(10) Patent No.: US 11,342,184 B2
(45) Date of Patent: May 24, 2022

(54) METHOD OF FORMING MULTIPLE PATTERNED LAYERS ON WAFER AND EXPOSURE APPARATUS THEREOF

(71) Applicant: XIA TAI XIN SEMICONDUCTOR (QING DAO) LTD., Qingdao (CN)

(72) Inventors: Bum-Hwan Jeon, Singapore (SG); Soo-Hyoung Kim, Singapore (SG); Siwon Yang, Singapore (SG); Kihyung Lee, Singapore (SG); Byung-In Kwon, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 151 days.

(21) Appl. No.: 16/694,974

(22) Filed: Nov. 25, 2019

(65) Prior Publication Data

US 2021/0159071 A1    May 27, 2021

(51) Int. Cl.
*H01L 21/027* (2006.01)
*H01L 23/544* (2006.01)
*G03F 7/20* (2006.01)

(52) U.S. Cl.
CPC ........ *H01L 21/0274* (2013.01); *G03F 7/2022* (2013.01); *H01L 23/544* (2013.01); *H01L 2223/54426* (2013.01)

(58) Field of Classification Search
CPC ............... H01L 21/0274; H01L 23/544; H01L 2223/54426; G03F 7/2022; G03F 7/095; G03F 7/203; G03F 7/70633; G03F 9/7046; G03F 7/0037; B33Y 10/00
USPC ...................................... 430/22, 5
See application file for complete search history.

(56) References Cited

U.S. PATENT DOCUMENTS

| | | | |
|---|---|---|---|
| 2004/0092080 A1* | 5/2004 | Chen | H01L 23/544 438/401 |
| 2015/0325472 A1* | 11/2015 | Aton | H01L 21/76877 438/586 |
| 2017/0133256 A1* | 5/2017 | Zhang | G03F 7/70633 |
| 2020/0073229 A1* | 3/2020 | Liu | H01L 27/1288 |

\* cited by examiner

*Primary Examiner* — Caleen O Sullivan
(74) *Attorney, Agent, or Firm* — ScienBiziP, P.C.

(57) ABSTRACT

An exposure apparatus for transferring a pattern of a reticle onto a wafer is provided. The exposure apparatus includes an illumination module, a reticle stage, a projection module, a wafer stage, and a control unit. The control unit is configured to calculate an alignment setting of the reticle. The wafer includes a first layer and a second layer disposed on the first layer. The first layer includes a first alignment parameter. The second layer includes a second alignment parameter. The control unit obtains a first weighting factor predetermined according to a property of the first layer, and a second weighting factor predetermined according to a property of the second layer. The alignment setting of the reticle is calculated according to the first alignment parameter, the first weighting factor, the second alignment parameter, and the second weighting factor.

12 Claims, 17 Drawing Sheets

S600

```
┌─────────────────────────────────────────────┐
│ Obtaining a first weighting factor predetermined │
│ according to a property of the first layer, and a │─ S601
│ second weighting factor predetermined according │
│ to a property of the second layer            │
└─────────────────────────────────────────────┘
                      ↓
┌─────────────────────────────────────────────┐
│ Calculating an alignment setting of the reticle │
│ according to a first value and a second      │
│ value, wherein the first value is calculated by │
│ the first alignment parameter and the first  │─ S602
│ weighting factor, and the second value is    │
│ calculated by the second alignment parameter │
│ and the second weighting factor              │
└─────────────────────────────────────────────┘
                      ↓
┌─────────────────────────────────────────────┐
│ Positioning the reticle based on the alignment │
│ setting calculated by the first value and the │─ S603
│ second value to perform the exposure         │
│ process of a third layer on the wafer        │
└─────────────────────────────────────────────┘
```

FIG. 6

METHOD OF FORMING MULTIPLE PATTERNED LAYERS ON WAFER AND EXPOSURE APPARATUS THEREOF

FIELD

The present disclosure generally relates to a method of forming multiple patterned layers on a wafer and an exposure apparatus thereof. More specifically, the present disclosure relates to a method that uses alignment parameters of at least two previous layers to pattern a next layer on a wafer.

BACKGROUND

Integrated circuits are generally made by photolithographic processes that use reticles (or photomasks) and an associated light source to project a circuit image on the surface of a semiconductor wafer. The photolithography process entails coating the semiconductor wafer with a layer of photoresist, exposing the layer of photoresist through a reticle and then developing the exposed photoresist layer. The reticle is generally made from flat pieces of quartz or soda-lime glass coated with a metallic layer (e.g., a chromium layer) forming a pattern for an electronic circuit.

FIG. 1A is a schematic diagram showing an exposure process for a wafer is illustrated. A first reticle 1210 having a pattern is exposed to a light source to transfer the pattern onto a first layer 110 of a wafer 100. Usually the pattern on the first reticle 1210 is zoomed out on the first layer 110 of the wafer 100. Multiple patterned layers may be formed on the wafer 100 to become circuits through multiple photolithographic processes. Alignment among patterns formed on the layers of the wafer 100 is crucial for the quality of an electronic device. The first reticle 1210 may include at least one reticle alignment mark 1211. During the exposure process, the reticle alignment mark 1211 is also transferred onto the first layer 110 of the wafer 100 as a layer alignment mark 111. The layer alignment mark 111 allows the alignment between an existing patterned layer (e.g., the first layer 110) on the wafer 100 and a next reticle for forming a pattern on a next layer of the wafer 100. As shown in FIG. 1B, a cross-sectional diagram of the wafer 100 is illustrated. After the exposure process of the first layer 110 (i.e., the first layer is patterned), the first layer 110 has the layer alignment mark 111. When forming a patterned second layer on the first layer 110, a second layer 120 coated with a photoresist layer PL is disposed on the patterned first layer 110 of the wafer 100. For the exposure process of the second layer 120, a second reticle 1220 should align its pattern to the patterned first layer 110. By aligning a reticle alignment mark 1221 of the second reticle 1220 with the layer alignment mark 111 of the first layer 110, such alignment requirement can be achieved, as shown in FIG. 1B.

If misalignment between the existing layer and the reticle has occurred during the exposure process, an overlay error between the layers of the wafer occurs. As shown in FIG. 1C, the first layer 110 and the second layer 120 are misaligned (i.e. the patterns of the first layer 110 and the second layer 120 are misaligned). For the purpose of simplicity, in FIG. 1C, the misalignment of the patterns of the first layer 110 and the second layer 120 is indicated by the misalignment of the layer alignment marks 111 and 121. Misalignment between the first layer 110 and the second layer 120 results in overlay error between the patterns of the first layer 110 and the second layer 120. Such overlay error between the layers of the wafer 100 is detected after forming each layer. The overlayer error between the layers of the wafer must be controlled within an acceptable range during the whole photolithographic processes. Undesired layers will be removed and reformed to ensure the quality of the electronic device. When forming a third patterned layer on the wafer 100 of FIG. 1C, a third layer 130 coated with a photoresist layer PL is disposed on the patterned second layer 120 of the wafer 100. For the exposure process of the third layer 130, a third reticle 1230 should align its pattern with the patterned second layer 120 (i.e., a reticle alignment mark 1231 of the third reticle 1230 aligns with the layer alignment mark 121 of the second layer 120, as shown in FIG. 1D). Alternatively, the third reticle 1230 may align its pattern with the patterned first layer 110 (i.e., the reticle alignment mark 1231 of the third reticle 1230 aligns with the layer alignment mark 111 of the first layer 110, as shown in FIG. 1E).

As the photolithographic process becomes finer and more complicated, the alignment between the reticle and the wafer becomes more challenging when forming multiple layers. There remains a need to provide a method to improve alignment process for forming multiple layers on the wafer.

SUMMARY

In view of above, the present disclosure is directed to a method and an exposure apparatus to improve alignment process for forming multiple layers on a wafer.

An implementation of the present disclosure is directed to a method of forming multiple patterned layers on a wafer. The wafer includes a reference mark for forming a circuit image. The method includes actions S401 to S407 as shown in FIG. 4. In action S401, a first layer of the wafer is patterned by exposing a pattern of a first reticle onto the first layer. The first reticle includes a first reticle mark configured to form a first layer mark on the first layer of the wafer. In action S402, a first alignment parameter of the first layer mark is measured with respect to the reference mark of the wafer. The first alignment parameter includes at least one of a first offset, a first scaling, and a first rotation. In action S403, a second layer of the wafer is patterned by exposing a pattern of a second reticle onto the second layer. The second reticle includes a second reticle mark configured to form a second layer mark on the second layer of the wafer. In action S404, a second alignment parameter of the second layer mark is measured with respected to the reference mark of the wafer. The second alignment parameter includes at least one of a second offset, a second scaling, and a second rotation. In action S405, a first weighing factor predetermined according to a property of the first layer and a second weighting factor predetermined according to a property of the second layer are obtained. In action S406, an alignment setting of a third reticle is calculated according to a first value and a second value. The first value is calculated by the first alignment parameter and the first weighting factor. The second value is calculated by the second alignment parameter and the second weighting factor. In action S407, a third layer of the wafer is patterned by exposing the third reticle according to the alignment setting calculated by the first value and the second value.

Another implementation of the present disclosure is directed to a method of aligning a reticle to a wafer during an exposure process. The wafer includes a first layer and a second layer. The first layer has a first alignment parameter. The second layer has a second alignment parameter. The method includes actions S601 to S603 as shown in FIG. 6. In action S601, a first weighting factor predetermined according to a property of the first layer and a second weighting factor predetermined according a property of the second layer. In action S602, an alignment setting of the reticle is calculated according to a first value and a second value. The first value is calculated by the first alignment parameter and the first weighting factor of the first layer. The second value is calculated by the second alignment parameter and the second weighting factor of the second layer. In action S603, the reticle is positioned based on the alignment setting calculated by the first value and the second value to perform the exposure process of a third layer on the wafer.

Yet another implementation of the present disclosure is directed to an exposure apparatus for transferring a pattern of a reticle onto a wafer. The exposure apparatus includes an illumination module, a reticle stage, a projection module, a wafer stage, and a control unit. The illumination module is configured to illuminate the reticle with light from a light source. The reticle stage is configured to hold the reticle. The projection module is configured to project the pattern of the reticle onto the wafer. The wafer stage is configured to position the wafer. The control unit is configured to calculate an alignment setting of the reticle. The wafer includes a first layer and a second layer disposed on the first layer. The first layer includes a first alignment parameter. The second layer includes a second alignment parameter. The control unit obtains a first weighting factor predetermined according to a property of the first layer, and a second weighting factor predetermined according to a property of the second layer. The alignment setting of the reticle is calculated according to the first alignment parameter, the first weighting factor, the second alignment parameter, and the second weighting factor.

As described above, the method and the exposure apparatus of the implementations of the present disclosure uses the alignment parameters of at least two previous layers to pattern a next layer. Therefore, the method and the exposure apparatus of the present disclosure can improve the patterning process for multiple layers on the wafer.

BRIEF DESCRIPTION OF THE DRAWINGS

Implementations of the present technology will now be described, by way of example only, with reference to the attached figures.

FIG. 6 is a flowchart of a method of aligning a reticle to a wafer according to yet another implementation of the present disclosure.

DETAILED DESCRIPTION

Figure 1A:
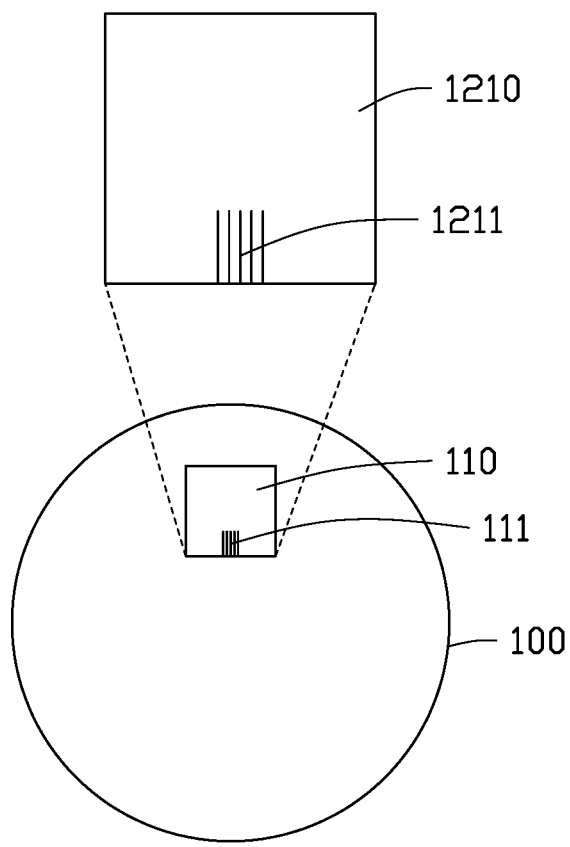
FIG. 1A is a schematic diagram showing an exposure process of a wafer.
Figure 1B:
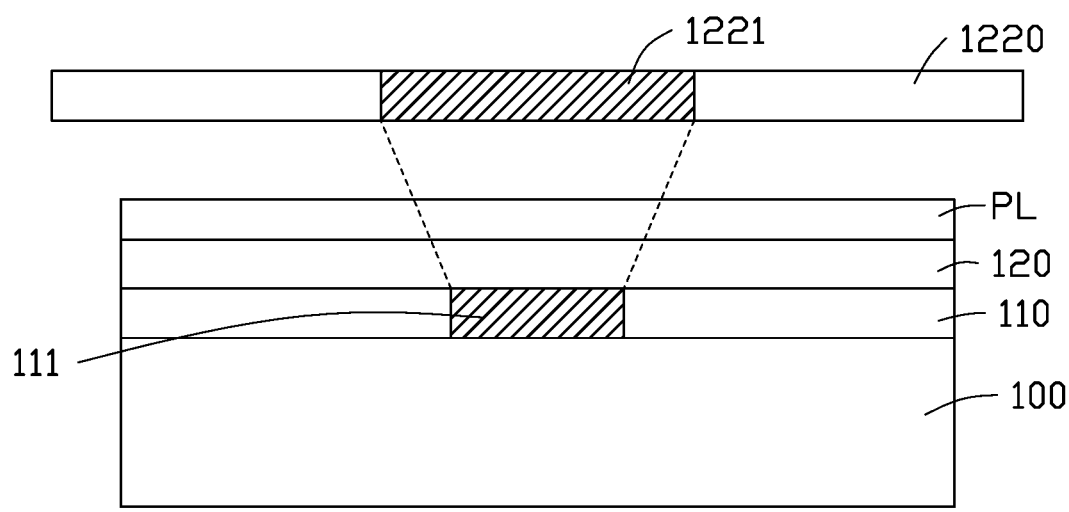
FIGS. 1B to 1E are schematic diagrams showing the exposure process of multiple layers on the wafer in related art.
Figure 1C:
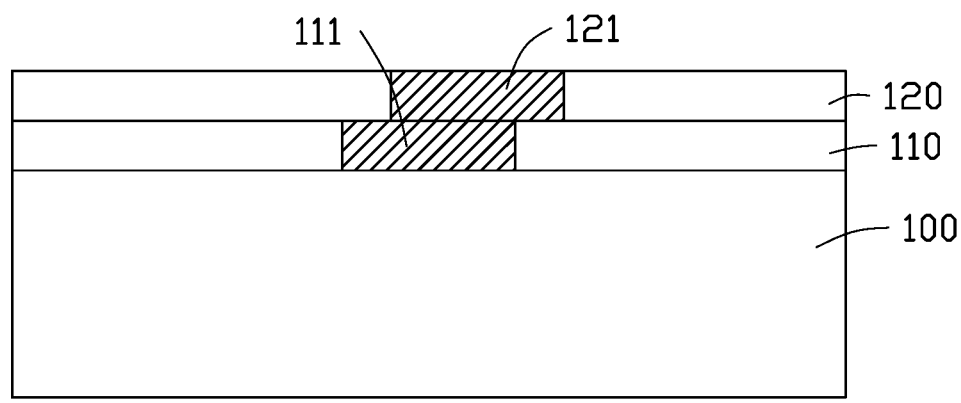
Figure 1D:
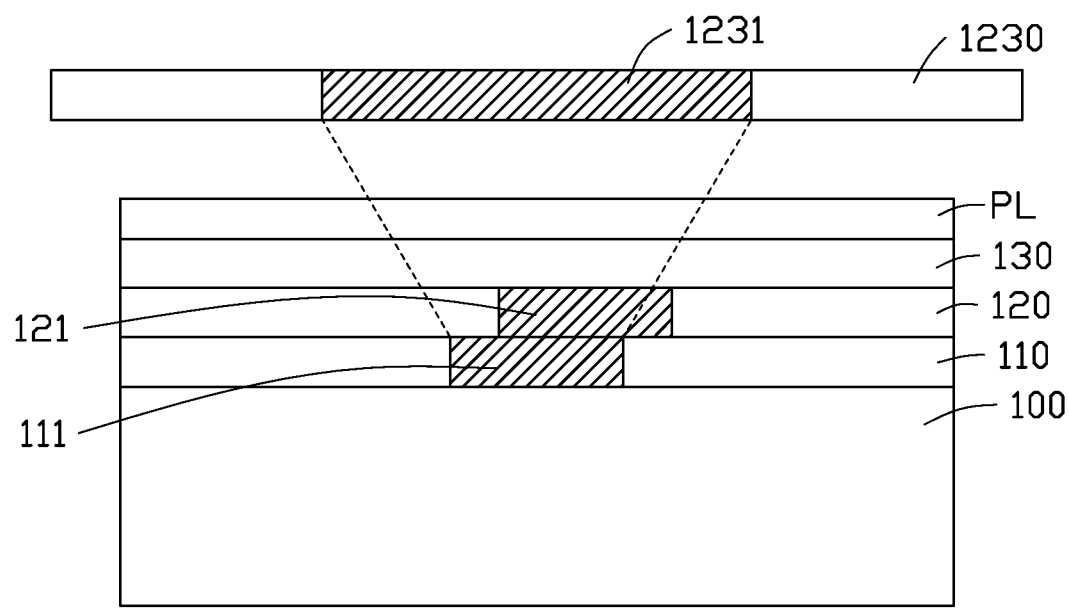
Figure 1E:
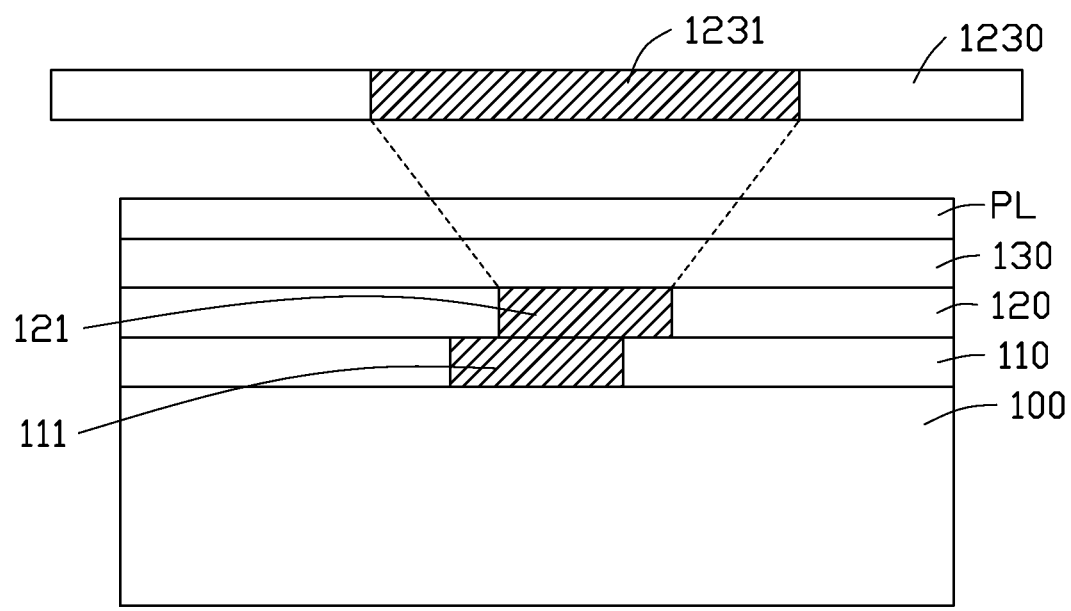

The present disclosure will now be described more fully hereinafter with reference to the accompanying drawings, in which example implementations of the disclosure are shown. This disclosure may, however, be implemented in many different forms and should not be construed as limited to the example implementations set forth herein. Rather, these example implementations are provided so that this disclosure will be thorough and complete, and will fully convey the scope of the disclosure to those skilled in the art. Like reference numerals refer to like elements throughout.

The terminology used herein is for the purpose of describing particular example implementations only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, actions, operations, elements, and/or components, but do not preclude the presence or addition of one or more other features, regions, integers, actions, operations, elements, components, and/or groups thereof.

It will be understood that the term "and/or" includes any and all combinations of one or more of the associated listed items. It will also be understood that, although the terms first, second, third etc. may be used herein to describe various elements, components, regions, parts and/or sections, these elements, components, regions, parts and/or sections should not be limited by these terms. These terms are only used to distinguish one element, component, region, part or section from another element, component, region, layer or section. Thus, a first element, component, region, part or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the example implementations of the present disclosure in conjunction with the accompanying drawings in FIGS. 2 to 6. Reference will be made to the drawing figures to describe the present disclosure in detail, wherein depicted elements are not necessarily shown to scale and wherein like or similar elements are designated by same or similar reference numeral through the several views and same or similar terminology.

The present disclosure will be further described hereafter in combination with the accompanying figures.

Figure 2:
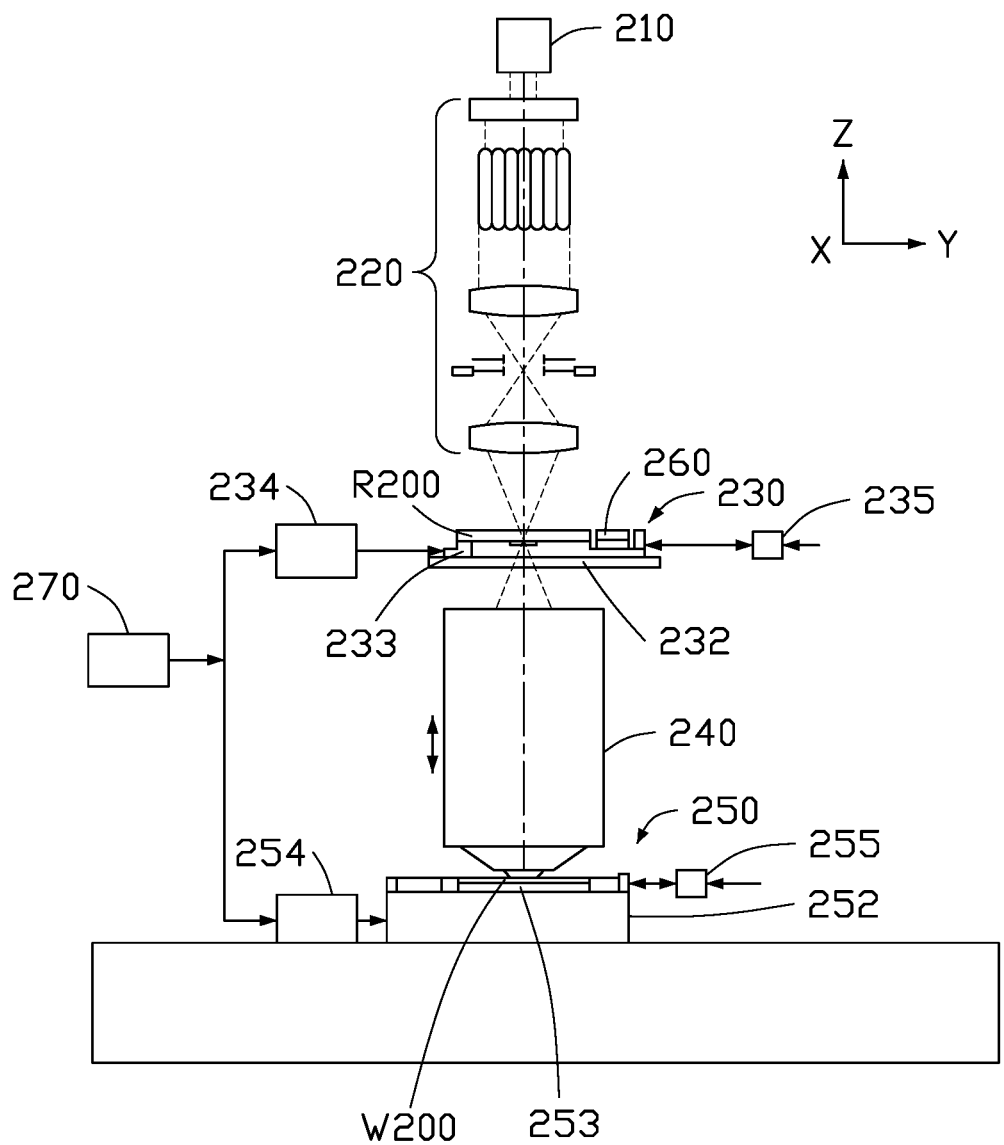
FIG. 2 is a schematic diagram of an exposure apparatus according to an implementation of the present disclosure.

Referring to FIG. 2, a schematic diagram of an exposure apparatus 200 according to an implementation of the present disclosure is illustrated. The exposure apparatus 200 is a lithography apparatus for transferring a pattern of a reticle R200 onto a wafer W200. The exposure apparatus 200 includes an illumination module 220 for illuminating the reticle R200 with light from a light source 210, a reticle stage 230 for positioning the reticle R200, and a projection module 240 for projecting the pattern of the reticle R200 onto the wafer W200. The exposure apparatus 200 also includes a wafer stage 250 for positioning the wafer W200, a determination unit 260, and a control unit 270.

The reticle stage 230 positions the reticle R200 by moving the reticle R200 in the Y-axis direction. In this implementation, the reticle stage 230 for holding the reticle R200 includes a reticle stage base 232, a reticle holder 233 disposed on the reticle stage base 232 and for holding the reticle R200 over the reticle stage base 232. A first driving unit 234 drives the reticle stage base 232 according to a driving pattern. A first interferometer 235 continuously measures the position of the reticle stage base 232. The control unit 270 controls the first driving unit 234 to move the reticle stage base 232 according to the driving pattern at high accuracy.

The determination unit 260 determines a feature of the reticle R200 placed on the reticle stage base 232. The determination unit 260 is constructed by, for example, a reading unit that reads an identifier such as a barcode formed on the reticle R200. Also, the determination unit 260 may be constructed by an image sensing unit that senses the image of the reticle R200, such as an area sensor, reflective sensor, or camera, and an image processing unit that processes an image sensed by the image sensing unit. The feature of the reticle R200 includes, for example, at least one of the type of the reticle or the shape of the reticle. The type of the reticle varies. Examples are a general reticle (e.g., a reticle on which a circuit pattern is drawn) used to fabricate a semiconductor device, and a special reticle used for a special purpose. The special reticle may include various jigs and is not limited to the reticle on which a circuit pattern is formed.

The projection module 240 projects the pattern of the reticle R200 illuminated by the light from the illumination module 220 at a predetermined magnification, such as ¼ or ⅕, onto the wafer W200. The projection module 240 may employ a first optical module solely including a plurality of lens elements, a second optical module including a plurality of lens elements and at least one concave mirror (e.g., a catadioptric optical system), a third optical module including a plurality of lens elements and at least one diffractive optical element such as a kinoform, and a full mirror module. Any necessary correction of the chromatic aberration may be performed by using a plurality of lens elements made from soda-lime glass materials having different dispersion values (or Abbe values), or arrange a diffractive optical element to disperses the light in a direction opposite to that of the lens elements.

The wafer stage 250 positions the wafer W200 by moving the wafer W200 in the X-axis and Y-axis directions. In this implementation, the wafer stage 250 includes a wafer stage base 252 on which the wafer W200 is placed, a wafer holder 253 for holding the wafer W200 on the wafer stage base 252, and a second driving unit 254 for driving the wafer stage base 252. A second interferometer 255 continuously measures the position of the wafer stage base 252. The control unit 270 controls the position of the wafer stage base 252 through the second driving unit 254 at high accuracy.

The control unit 270 includes a central processing unit (CPU) and a memory, and controls the overall operation of the exposure apparatus 200. The control unit 270 controls an exposure process of transferring the pattern of the reticle R200 onto the wafer W200.

Figure 3:
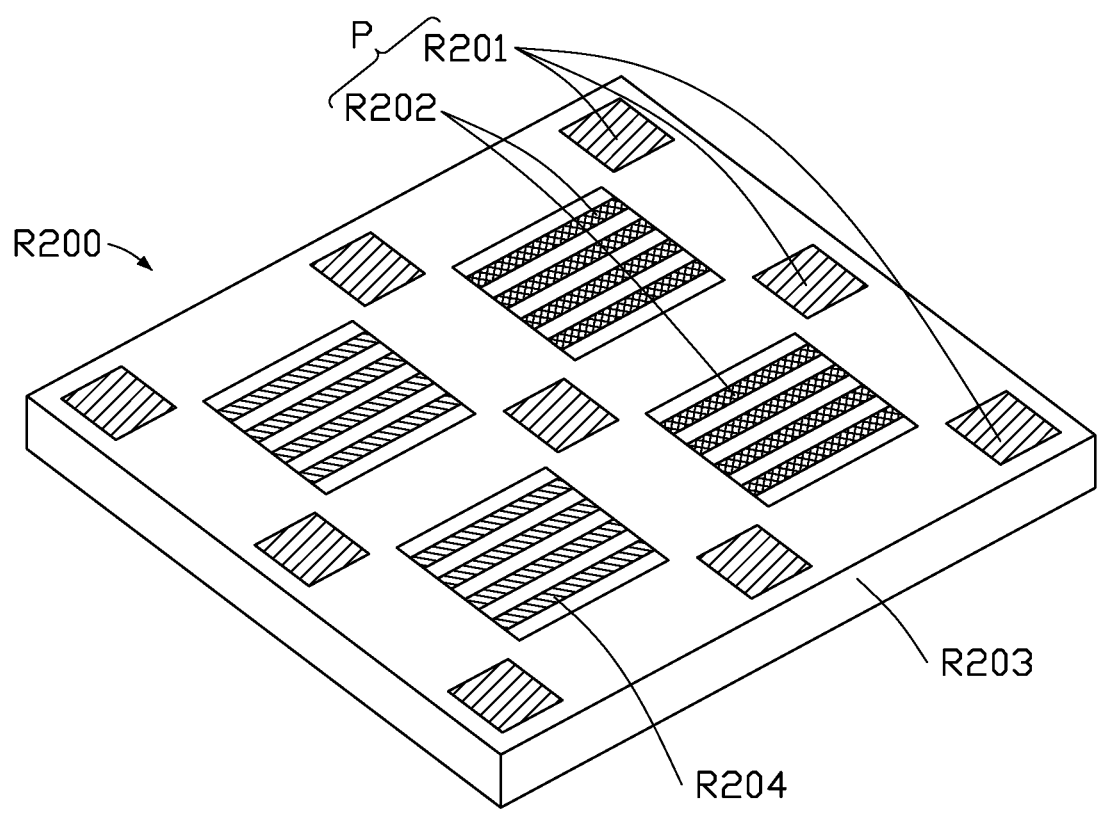
FIG. 3 is a schematic diagram of a reticle for the exposure apparatus of FIG. 2.

Referring to FIG. 3, a schematic diagram of the reticle R200 is illustrated. the reticle R200 includes a transparent layer R203 and a metallic layer R204. The metallic layer R204 is disposed on the transparent layer R203 and forms the pattern P at one side of the reticle R200. The pattern P includes at least one circuit pattern R202 and at least one reticle mark R201 (i.e., alignment mark on reticle). The reticle mark R201 may be Versatile Scribelane Primary Marks (VSPMs) or Primary Marks (PMs). The circuit pattern R202 is configured to form a circuit image on the wafer W200. The reticle mark R201 is configured to align the reticle R200 to the wafer W200. The transparent layer R203 of the reticle R200 may be a quartz layer or a soda-lime glass layer. The metallic layer R204 of the reticle R200 has gaps and lines for forming the pattern for transferring the circuit image to the wafer W200. Preferably, the metallic layer R204 is a chromium layer.

Figure 4:
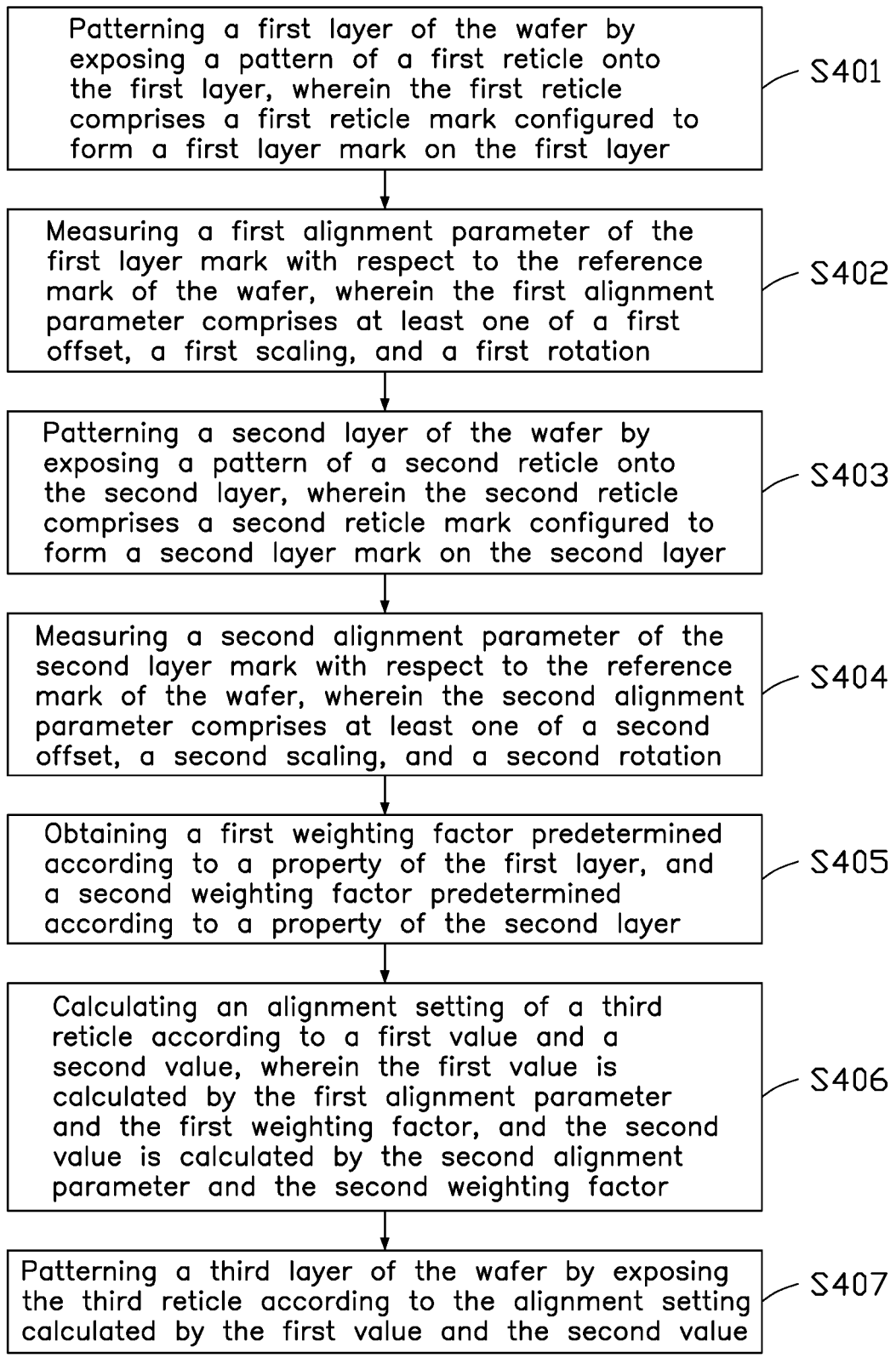
FIG. 4 is a flowchart of a method of forming multiple patterned layers on a wafer according to another implementation of the present disclosure.
Figure 5A:
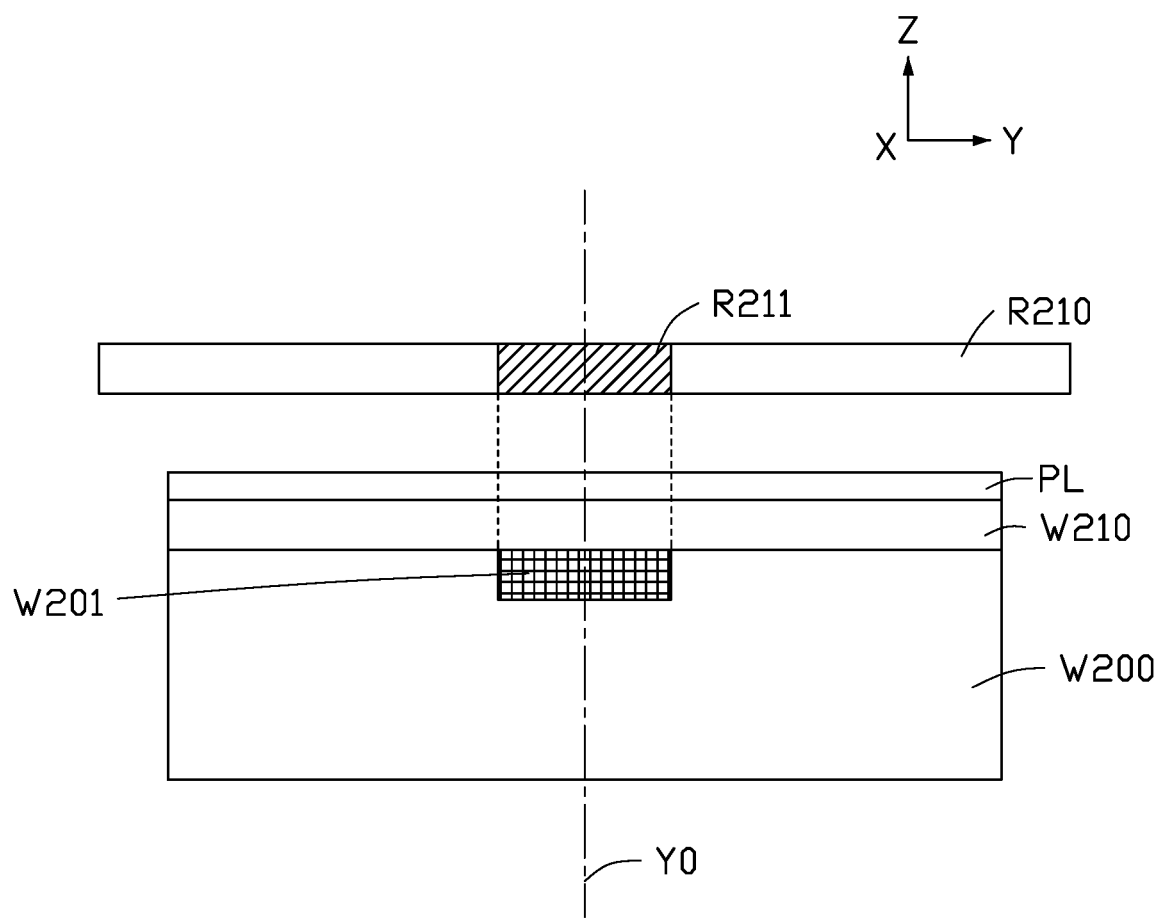
FIGS. 5A to 5F are schematic diagrams showing the actions of the method in FIG. 4.
Figure 5B:
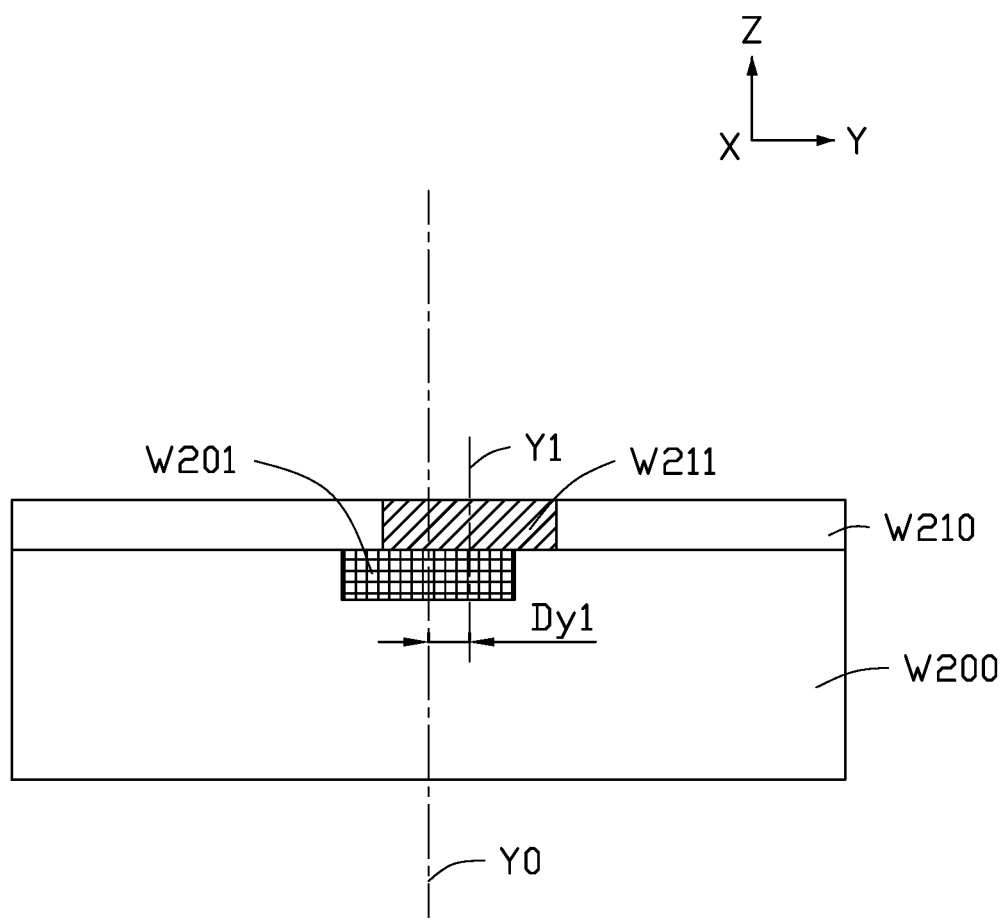

Referring to FIG. 4, a flowchart of a method S400 of forming multiple patterned layers on a wafer according to another implementation of the present disclosure is illustrated. The method S400 includes actions S401 to S407. The action of the method S400 is illustrated in FIGS. 5A to 5F. The wafer W200 has a reference mark W201 for forming a circuit image. The reference mark W201 serves as a reference position for forming the multiple patterned layers on the wafer W200. In action S401, a first layer W210 of the wafer W200 is patterned by exposing a pattern of a first reticle R210 onto the first layer W210. The action S401 is illustrated in FIGS. 5A and 5B. The first layer W210 of the wafer W200 is patterned through an exposure process of an exposure apparatus. The exposure apparatus can be referred to the exposure apparatus 200 of FIG. 2. Before the exposure process, the first layer W210 coated with a photoresist layer PL is deposited on the wafer W200. Then, the wafer W200 is loaded to the exposure apparatus 200 to be exposed with the first reticle R210, as shown in FIG. 5A. The first reticle R210 is similar to the reticle R200 of FIG. 3. The first reticle R210 includes a first reticle mark R211 configured to form a first layer mark W211 (i.e., the alignment mark on the layer of the wafer) on the first layer W210 of the wafer W200. During the exposure process of the first layer W210, the first reticle mark R211 of the first reticle R210 aligns with the reference mark W201 of the wafer W200. By using Y-coordinate as an example, the first reticle mark R211 aligns with a reference Y-position Y0 of the reference mark W201 to perform the exposure process of the first layer W210, as shown in FIG. 5A. After the exposure process, as shown in FIG. 5B, the first layer W210 is patterned through developing the photoresist layer PL and etching the first layer W210. The first reticle mark R211 is transferred to the first layer W210 to become the first layer mark W211. The first layer mark W211 and the reference mark W201 may be designed to overlap completely, partially, or not at all. As shown in FIGS. 5A and 5B, for simplicity, the first layer mark W211 and the reference mark W201 are designed to overlap completely. In some implementations, the first layer mark W211 and the reference mark W201 may be designed to be separated parallelly by a predetermined distance. The photoresist layer PL coated on the first layer is removed after the first layer W220 is patterned.

In action S402, a first alignment parameter of the first layer mark W211 is measured with respect to the reference mark W201 of the wafer W200. In other words, the first alignment parameter of the first layer mark W211 is measured by detecting parameters of the first layer mark W211 with respect to parameters of the reference mark W201 to indicate the alignment of the pattern formed on the first layer W210. As shown in FIG. 5B, after the first layer W210 is patterned, the pattern on the first layer W210 may not be accurately positioned with respect to the reference mark W201 of the wafer W200 (i.e., the first layer mark W211 misaligns with the reference mark W201 at Y-coordinate). Such misalignment may be allowable within a certain range. The first alignment parameter may be measured by an image detector which detects lights reflected from the first layer mark W211 and the reference mark W201. The first alignment parameter may include at least one of a first offset, a first scaling, and a first rotation. The first alignment parameter indicates a difference between the first layer mark W211 formed on the first layer W210 and the original design of first layer mark W211. For example, the first offset of the first alignment parameter indicates a displacement of the first layer mark W211 formed on the first layer W210 to an originally designed position of the first layer mark W211. In the implementations that the first layer mark W211 are designed to overlap with the reference mark W201, the first alignment parameter is indicated by the difference between the first layer mark W211 formed on the first layer W210 to the reference mark W201. The first offset of the first alignment parameter includes a first X-offset and a first Y-offset corresponding to X and Y displacements of the first layer mark W211 with respect to the reference mark W201. As shown in FIG. 5B, the first alignment parameter includes a first Y-offset Dy1 which is the distance between the reference Y-position Y0 of the reference mark W201 and a first Y-position Y1 of the first layer mark W211. The first scaling includes a first X-scaling and a first Y-scaling corresponding to X and Y scaling of the first layer mark W211 with respect to the reference mark W201. The first rotation includes a first X-rotation and a first Y-rotation corresponding to X and Y rotations of the first layer mark W211 with respect to the reference mark W201.

Figure 5C:
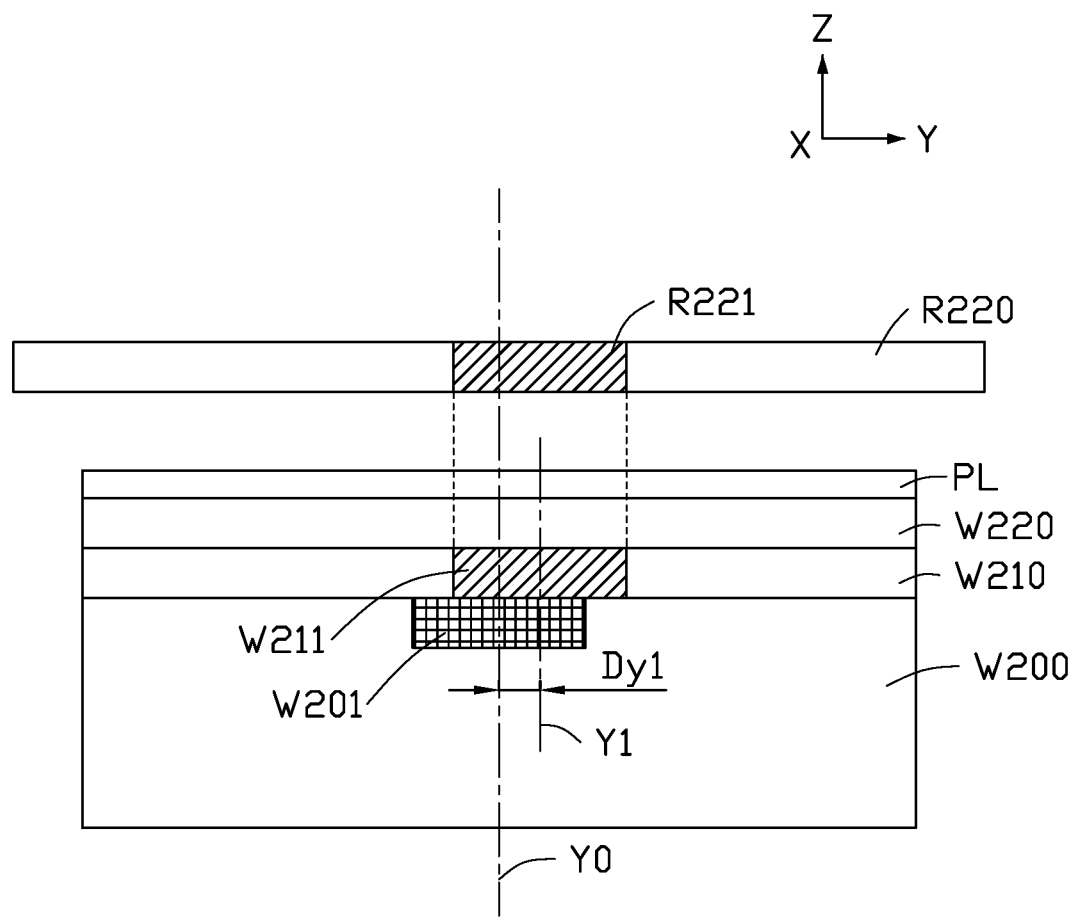
Figure 5D:
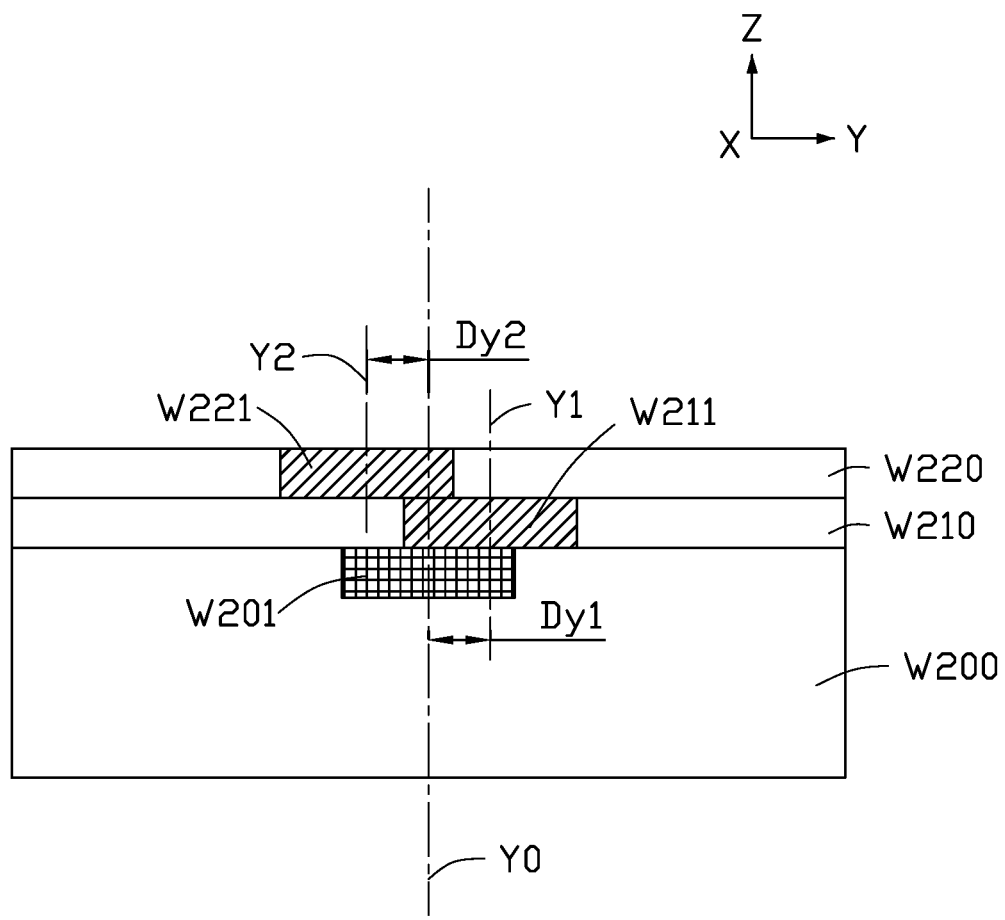

In action S403, a second layer W220 of the wafer W200 is patterned by exposing a pattern of a second reticle R220 onto the second layer W220. The action S403 is illustrated in FIGS. 5C and 5D. The second layer W220 of the wafer W200 is patterned through an exposure process of the exposure apparatus 200 of FIG. 2. Before the exposure process, the second layer W220 coated with a photoresist layer PL is deposited on the first layer W210 of the wafer W200. Then, the wafer W200 is loaded to the exposure apparatus 200 to be exposed with the second reticle R220, as shown in FIG. 5C. The second reticle R220 is similar to the reticle R200 of FIG. 3. The second reticle R220 includes a second reticle mark R221 configured to form a second layer mark W221 (i.e., the alignment mark on the layer of the wafer) on the second layer W220 of the wafer W200. During the exposure process of the second layer W220, the second reticle mark R221 of the second reticle R220 aligns with the first layer mark W211 of the first layer W210, as shown in FIG. 5C. By using Y-coordinate as an example, the second reticle mark R221 aligns with a reference Y-position Y1 of the first layer mark W211 to perform the exposure process of the second layer W220, as shown in FIG. 5C. In some implementations, the second reticle mark R221 of the second reticle R220 may align with the reference mark W201 (i.e., the second reticle mark R221 aligns with the reference Y-position Y0 of the reference mark W201) to perform the exposure process of the second layer W220. After the exposure process, as shown in FIG. 5D, the second layer W220 is patterned through developing the photoresist layer PL and etching the second layer W220. The second reticle mark R221 is transferred to the second layer W220 to become the second layer mark W221. The photoresist layer PL coated on the second layer is removed after the second layer W220 is patterned.

In action S404, a second alignment parameter of the second layer mark W221 is measured with respect to the reference mark W201 of the wafer W200. In other words, the second alignment parameter of the second layer mark W221 is measured by detecting parameters of the second layer mark W221 with respect to parameters of the reference mark W201 to indicate the alignment of the pattern formed on the second layer W220. As shown in FIG. 5D, after the second layer W220 is patterned, the pattern on the second layer W220 may not be accurately positioned with respect to the pattern of the first layer W210 (i.e., the second layer mark W221 misaligns with the first layer mark W211 at Y-coordinate). Such misalignment may be allowable within a certain range. The second alignment parameter may be measured by an image detector which detects lights reflected from the second layer mark W221 and the reference mark W201. The second alignment parameter may include at least one of a second offset, a second scaling, and a second rotation. The second alignment parameter indicates a difference between the second layer mark W221 formed on the second layer W220 and the original design of second layer mark W221. For example, the second offset of the second alignment parameter indicates a displacement of the second layer mark W221 formed on the second layer W220 to an originally designed position of the second layer mark W221. In the implementations that the second layer mark W221 are designed to overlap with the reference mark W201, the second alignment parameter is indicated by the difference between the second layer mark W221 formed on the second layer W220 to the reference mark W201. The second offset of the second alignment parameter includes a second X-offset and a second Y-offset corresponding to X and Y displacements of the second layer mark W221 with respect to the reference mark W201. As shown in FIG. 5D, the second alignment parameter includes a second Y-offset Dy2 which is the distance between the reference Y-position Y0 of the reference mark W201 and a second Y-position Y2 of the second layer mark W221. The second scaling includes a second X-scaling and a second Y-scaling corresponding to X and Y scalings of the second layer mark W221 with respect to the reference mark W201. The second rotation includes a second X-rotation and a second Y-rotation corresponding to X and Y rotations of the second layer mark W221 with respect to the reference mark W201.

In action S405, a first weighting factor predetermined according to a property of the first layer W210 and a second weighting factor predetermined according to a property of the second layer W220 are obtained. The first weighting factor and the second weighting factor may be obtained by the control unit 270 of the exposure apparatus 200. Each of the first weighting factor and the second weight factor is within a range of 0 to 1. The first weighting factor and the second weighting factor may be the same or different. A sum of the first weighting factor and the second weighting factor equals to 1. For example, the first weighting factor is 0.5; and the second weighting factor is 0.5. Or, the first weighting factor is 0.4; and the second weighting factor is 0.6.

In action S406, an alignment setting of a third reticle R230 is calculated according to a first value and a second value. The first value is calculated by the first alignment parameter and the first weighting factor; and the second value is calculated by the second alignment parameter and the second weighting factor. Preferably, the first value is a product of the first alignment parameter and the first weighting factor; and the second value is a product of the second alignment parameter and the second weighting factor. The alignment setting of the third reticle R230 is a sum of the first value and the second value. In other words, the alignment setting of the third reticle R230 is calculated by an equation $AS = WF1 \times AP1 + WF2 \times AP2$, where AS is the alignment setting of the third reticle R230, WF1 is the first weighting factor, AP1 is the first alignment parameter, WF2 is the second weighting factor, and AP2 is the second alignment parameter. The alignment setting also includes at least one of an offset, a scaling, and a rotation. The offset of the alignment setting includes a X-offset and a Y-offset. The scaling of the alignment setting includes a X-scaling and a Y-scaling. The rotation of the alignment setting includes a X-rotation and a Y-rotation. By using the Y-offset as an example, as shown in FIG. 5D, the alignment setting of the third reticle R230 at Y-offset is calculated by WF1×Dy1+ WF2×(−Dy2). For example, when WF1 and WF2 are both 0.5, Dy1 is 2, and Dy2 is 3, the alignment setting of the third reticle R230 at Y offset is calculated to be −0.5. Similarly, the alignment setting of the third reticle R230 for X-offset, X-scaling, Y-scaling, X-rotation, and Y-rotation can be calculated accordingly. The first weighting factor and the second weighting factor respectively indicates the effects of the first layer W210 and the second layer W220 to the patterning of a third layer. If the first weighting factor is higher than the second weighting factor, it means that compared the second layer W220, the first layer W210 has stronger effect to the patterning of the third layer.

Figure 5E:
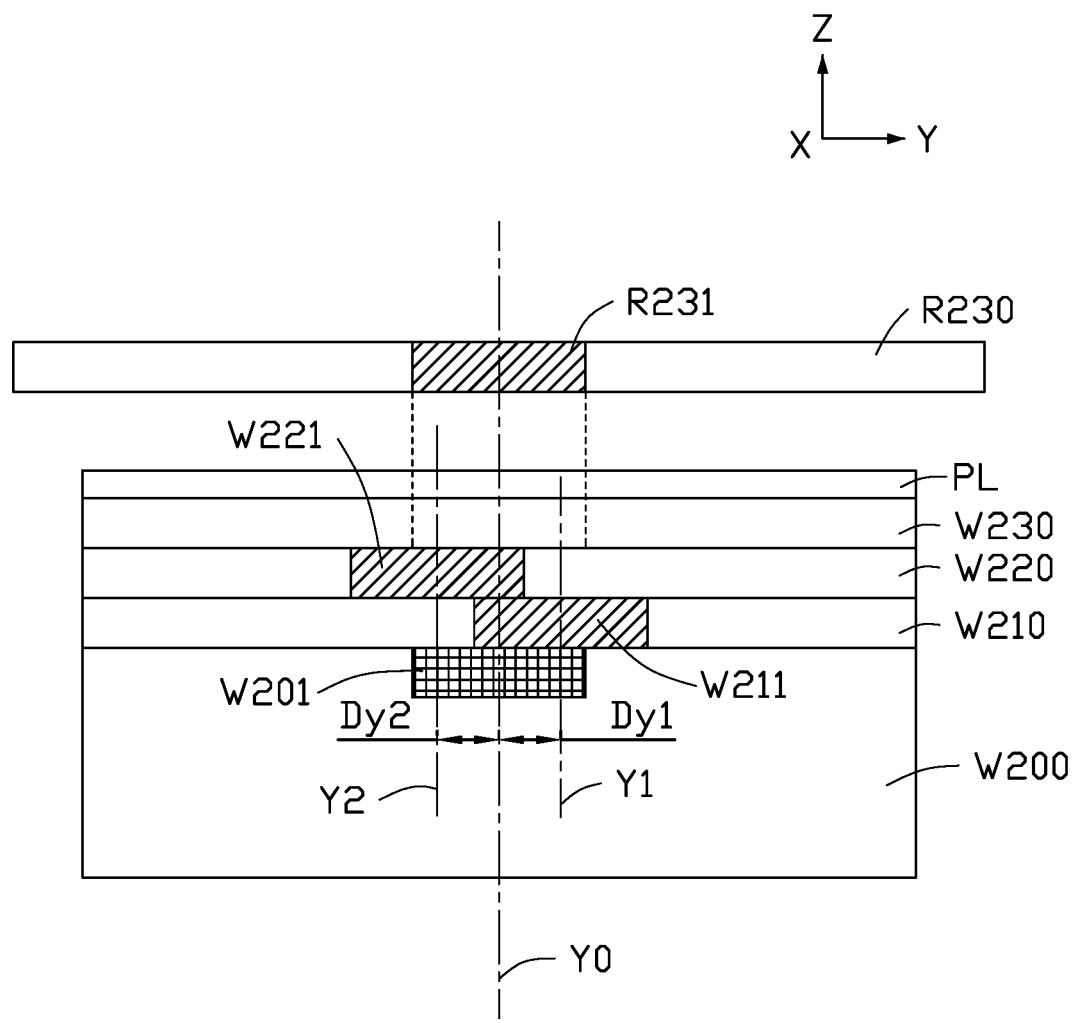
Figure 5F:
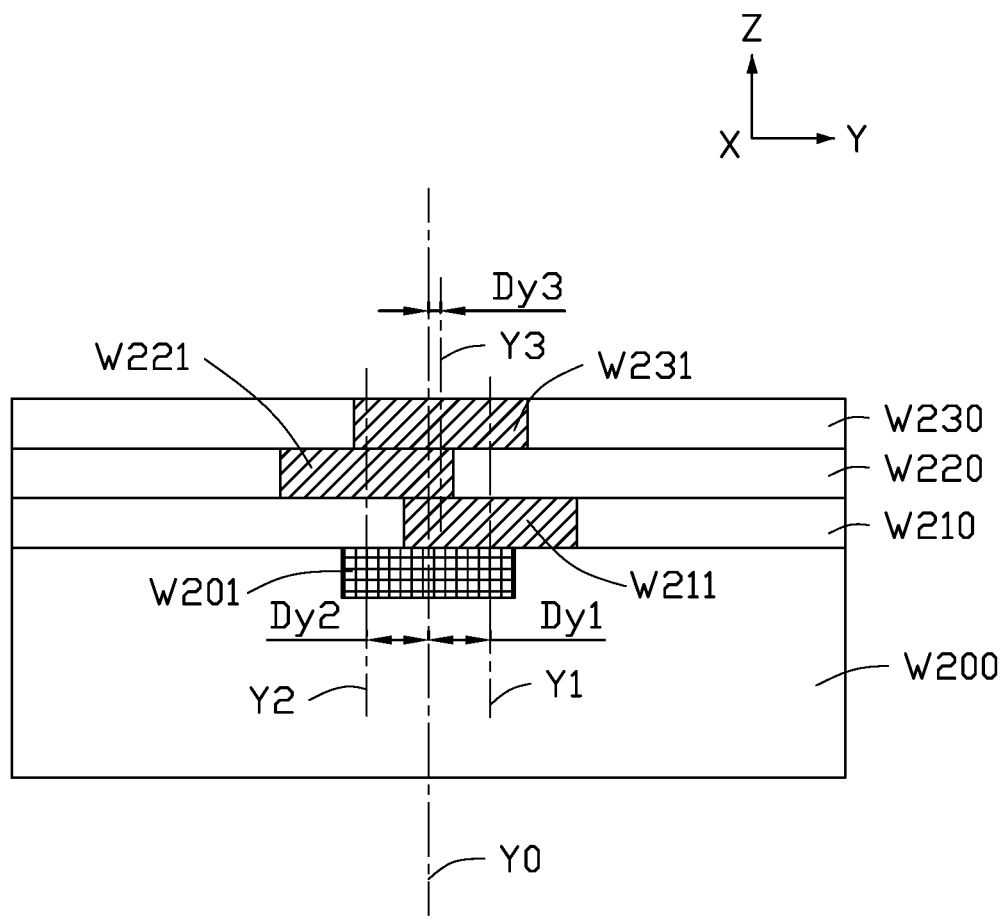

In action S407, a third layer W230 of the wafer is patterned by exposing the third reticle R230 according to the alignment setting calculated by the first value and the second value. The action S407 is illustrated in FIGS. 5E and 5F. The third layer W230 of the wafer W200 is patterned through an exposure process of the exposure apparatus 200 of FIG. 2. Before the exposure process, the third layer W230 coated with a photoresist layer PL is deposited on the second layer W220 of the wafer W200. Then, the wafer W200 is loaded to the exposure apparatus 200 to be exposed with the third reticle R230, as shown in FIG. 5E. The third reticle R230 is similar to the reticle R200 of FIG. 3. The third reticle R230 includes a third reticle mark R231 configured to form a third layer mark W231 (i.e., the alignment mark on the layer of the wafer) on the third layer W230 of the wafer W200. During the exposure process of the third layer W230 (i.e., the pattering of the third layer W230), the third reticle mark R231 of the third reticle R230 aligns at the alignment setting calculated by the first value and the second value in action S406. By using Y-offset as an example, as shown in FIG. 5E, the alignment setting of the third reticle R230 at Y-offset is calculated by WF1×Dy1+WF2×(−Dy2). For example, when WF1 and WF2 are both 0.5, Dy1 is 2, and Dy2 is 3, the third reticle R230 aligns at −0.5 for Y offset. After the exposure process, as shown in FIG. 5F, the third layer W230 is patterned through developing the photoresist layer PL and etching the third layer W230. The third reticle mark R231 is transferred to the third layer W230 to become the third layer mark W231. The photoresist layer PL coated on the third layer is removed after the third layer W230 is patterned.

Figure 5G:
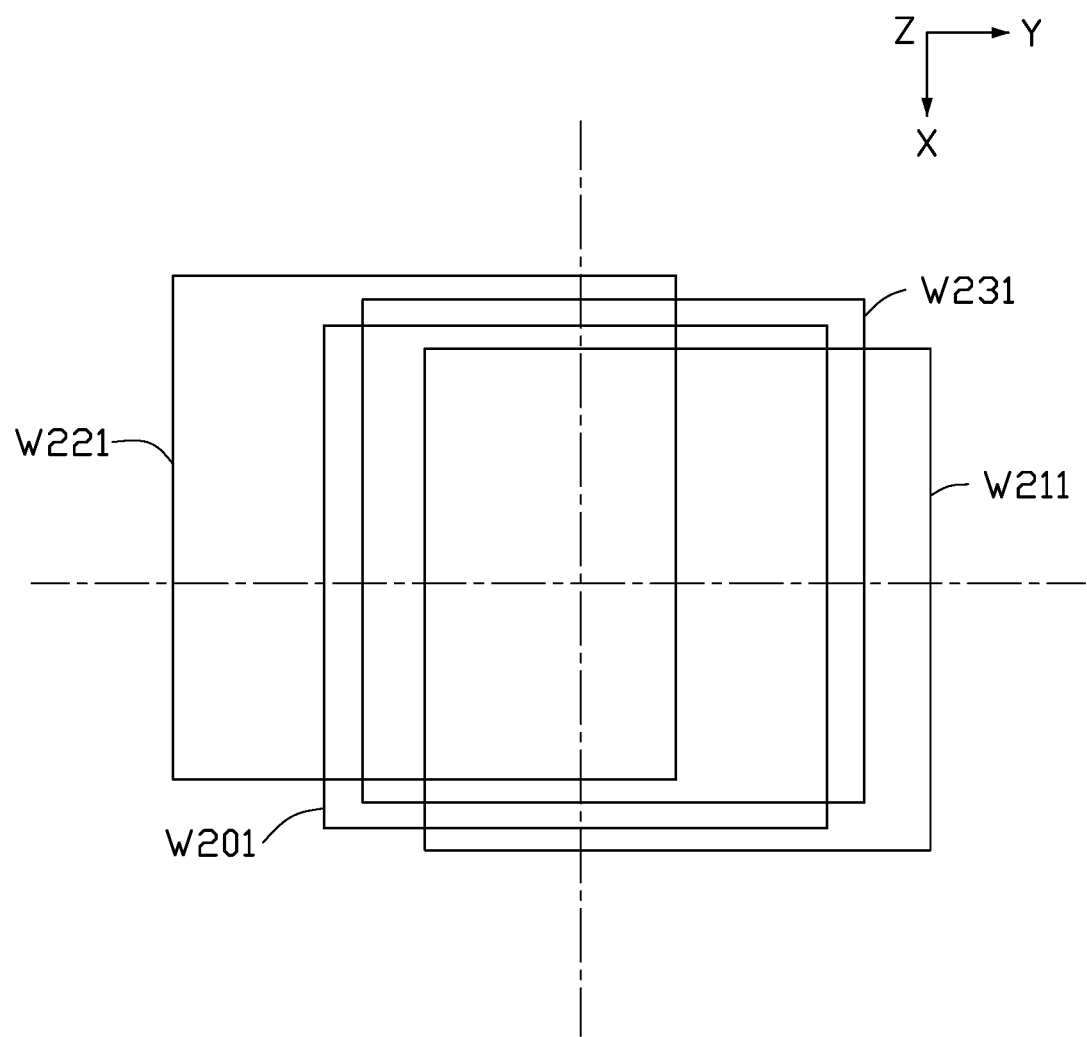
FIGS. 5G to 5I are schematic diagrams showing top views of layer marks on the wafer according to the method in FIG. 4.
Figure 5H:
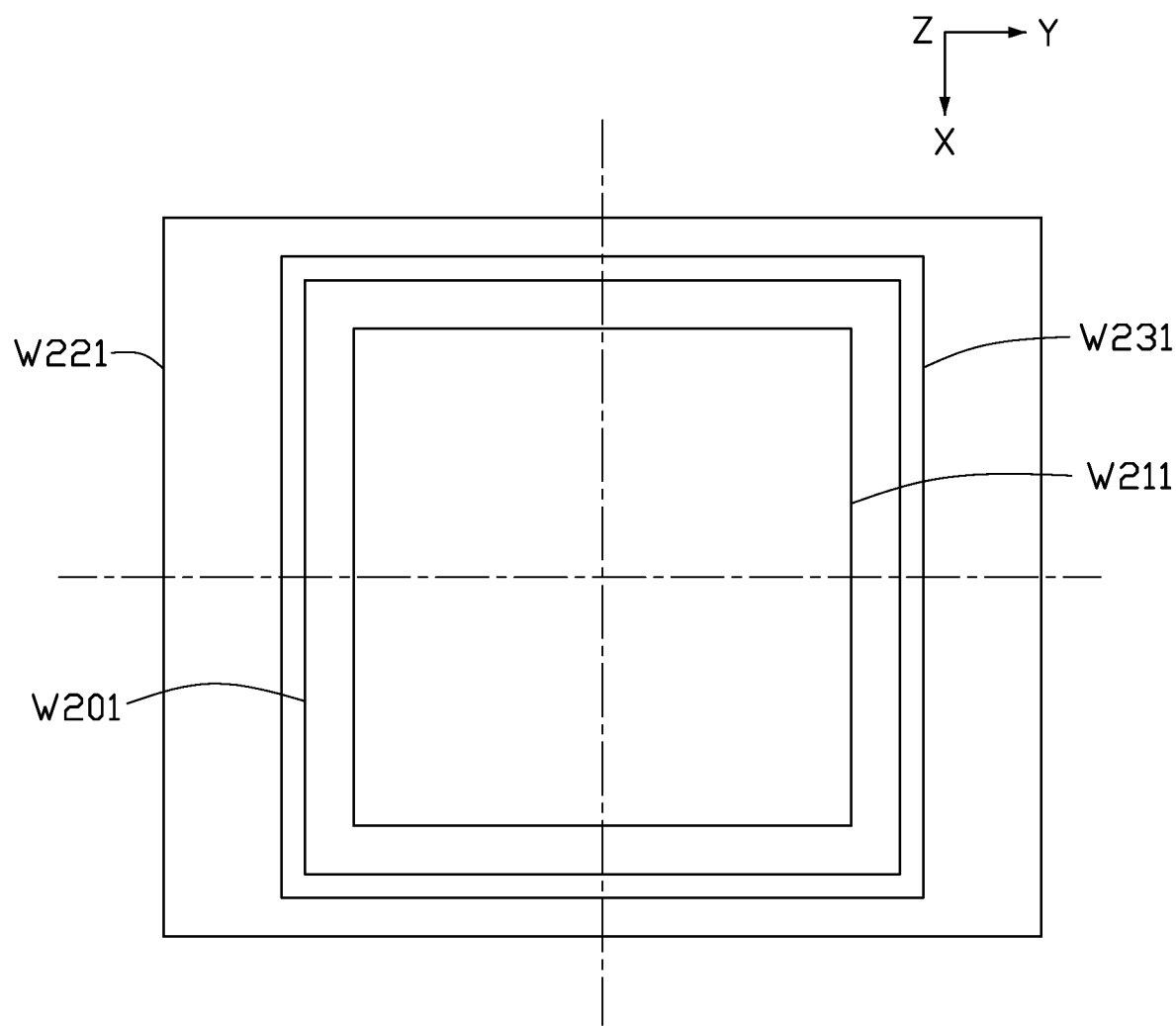
Figure 5I:
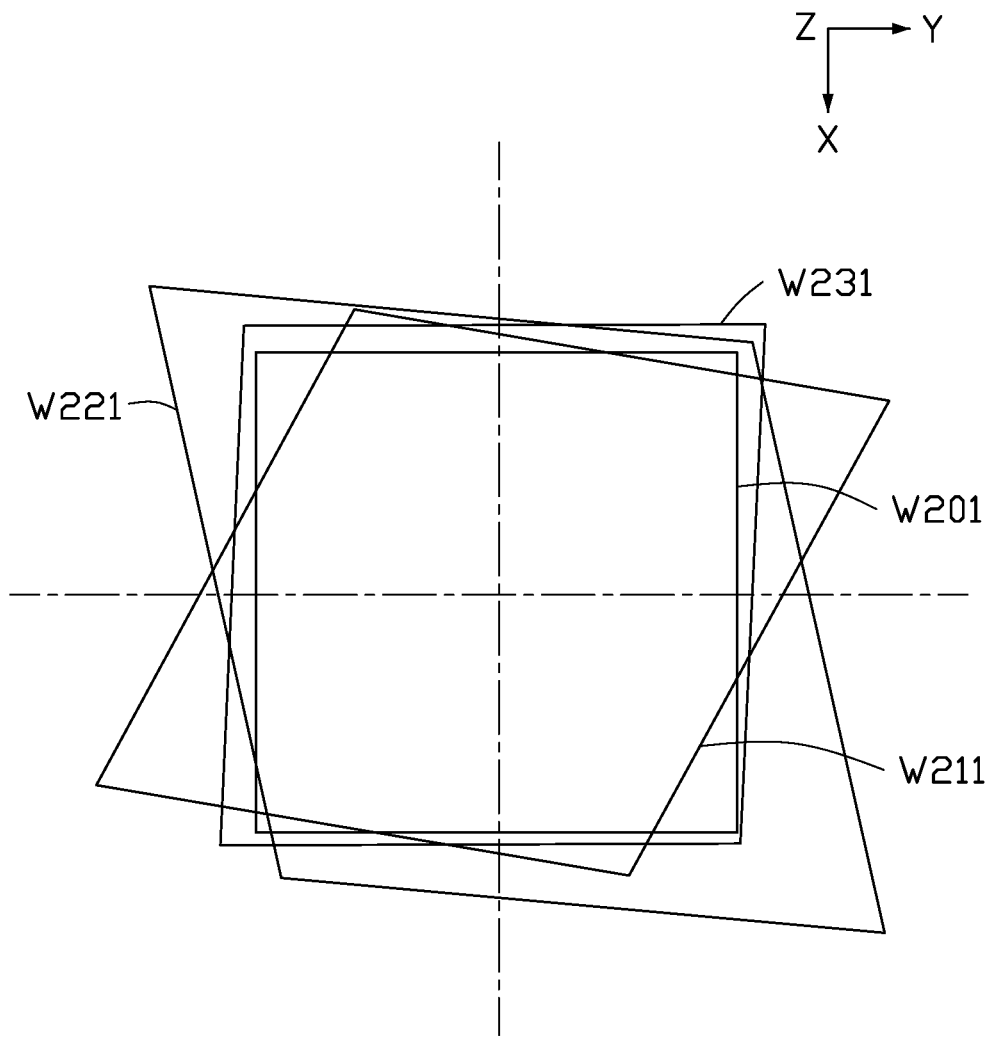
Figure 5J:
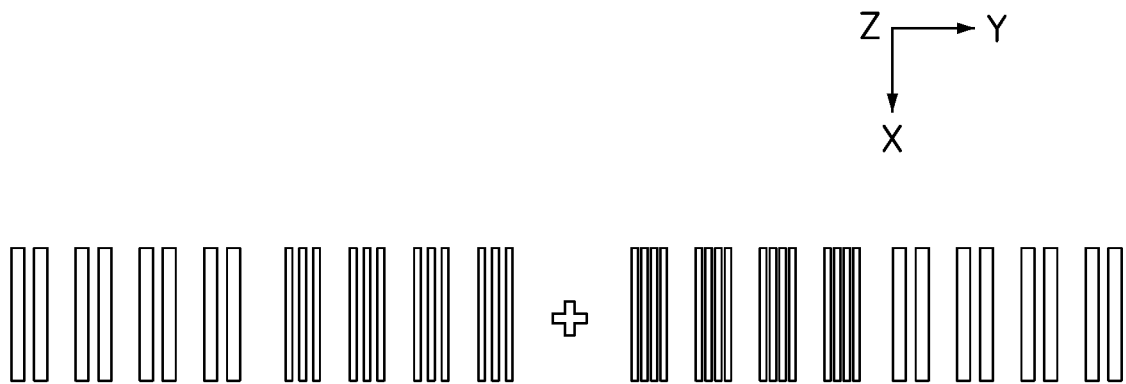
FIGS. 5J and 5K are schematic diagrams showing example layer marks.
Figure 5K:
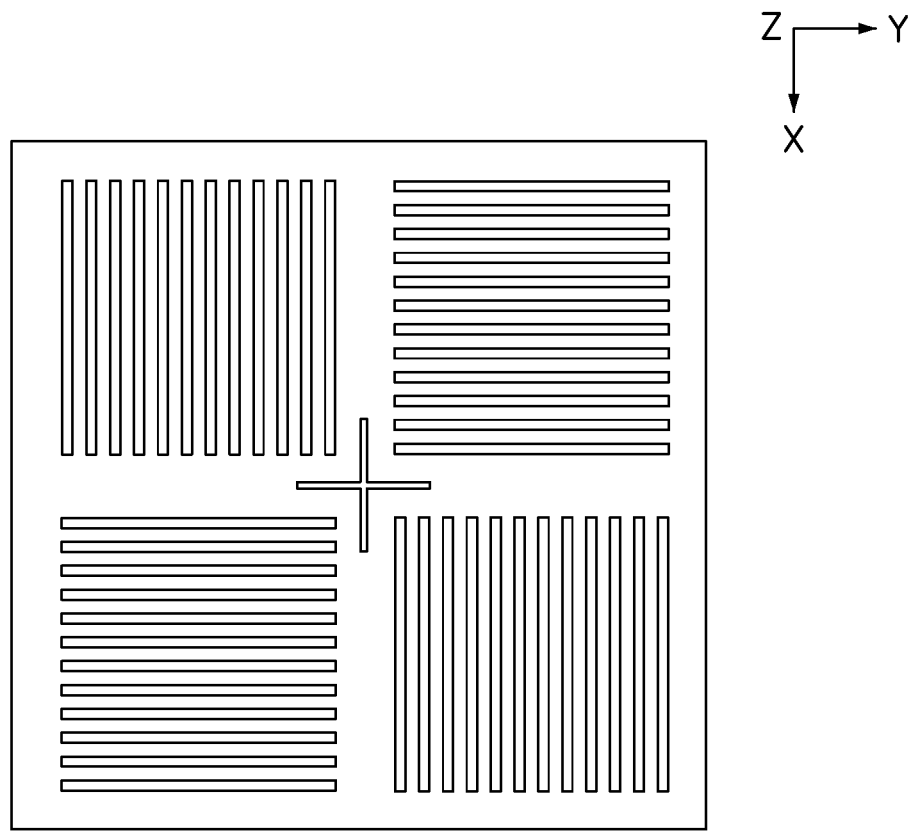

Referring to FIGS. 5G to 5I, top views of the layer marks (i.e., the first layer mark W211, the second layer mark W221, and the third layer mark W231) and the reference mark W201 of the wafer W200 of the method S400 are illustrated. In FIG. 5G, a schematic diagram showing the X-offsets and Y-offsets of the layer marks W211, W221, and W231 with respect to the reference mark W201 is illustrated. In FIG. 5H, a schematic diagram showing the X-scalings and the Y-scalings of the layer marks W211, W221, and W231 with respect to the reference mark W201 is illustrated. In FIG. 5I, a schematic diagram showing the X-rotations and the Y-rotations of the layer marks W211, W221, and W231 with respect to the reference mark W201 is illustrated. As shown in FIGS. 5G to 5I, the third layer mark W231 has better alignment with respect to the reference mark W201 compared to the first layer mark W221 and the second layer mark W211. Referring to FIGS. 5J and 5K, schematic diagrams showing example lay marks are illustrated.

When patterning a fourth layer on the wafer W200 with a fourth reticle, actions similar S404 to S407 to can be repeated. To be specifically, the fourth layer is patterned by exposing the fourth reticle according to an alignment setting calculated by a third weighing factor of the third layer, a third alignment parameter of the third layer, the second weighting factor of the second layer, and the second alignment parameter of the second layer. Accordingly, the method of the present disclosure uses the alignment parameters of at least two previous layers to pattern a next layer. Therefore, the method of the present disclosure can improve the patterning process for multiple layers on the wafer.

Referring to FIG. 6, a flowchart of a method S600 of aligning a reticle to a wafer during an exposure process according to another implementation of the present disclosure is illustrated. As shown in FIG. 6, the method S600 includes actions S601 to S603. The method S600 may be carried out by the exposure apparatus 200 of FIG. 2. The wafer and the reticle can be referred to the wafer W200 and the reticle R230 of FIGS. 5E and 5F. The wafer W200 has a first layer W210 and a second layer W220. The first layer W210 of the wafer W200 has a first alignment parameter; and the second layer W220 of the wafer W200 has a second alignment parameter. The first alignment parameter of the first layer mark W211 is measured by detecting parameters of a first layer mark W211 of the first layer W210 with respect to parameters of a reference mark W201 of the wafer W200 to indicate the alignment of the pattern formed on the first layer W210. As shown in FIG. 5E, the pattern on the first layer W210 may not be accurately positioned with respect to the reference mark W201 of the wafer W200 (i.e., the first layer mark W211 misaligns with the reference mark W201 at Y-coordinate). Such misalignment may be allowable within a certain range. The first alignment parameter of the first layer W210 may be measured by an image detector which detects lights reflected from the first layer mark W211 and the reference mark W201. The first alignment parameter of the first layer W210 may include at least one of a first offset, a first scaling, and a first rotation. The first offset includes a first X-offset and a first Y-offset corresponding to X and Y displacements of the first layer mark W211 with respect to the reference mark W201. As shown in FIG. 5E, the first alignment parameter includes a first Y-offset Dy1 which is the distance between a reference Y-position Y0 of the reference mark W201 and a first Y-position Y1 of the first layer mark W211. The first scaling includes a first X-scaling and a first Y-scaling corresponding to X and Y scalings of the first layer mark W211 with respect to the reference mark W201. The first rotation includes a first X-rotation and a first Y-rotation corresponding to X and Y rotations of the first layer mark W211 with respect to the reference mark W201.

The second alignment parameter of the second layer W220 may include at least one of a second offset, a second scaling, and a second rotation. The second offset includes a second X-offset and a second Y-offset corresponding to X and Y displacements of the second layer mark W221 with respect to the reference mark W201. As shown in FIG. 5E, the second alignment parameter includes a second Y-offset Dy2 which is the distance between the reference Y-position Y0 of the reference mark W201 and a second Y-position Y2 of the second layer mark W221. The second scaling includes a second X-scaling and a second Y-scaling corresponding to X and Y scalings of the second layer mark W221 with respect to the reference mark W201. The second rotation includes a second X-rotation and a second Y-rotation corresponding to X and Y rotations of the second layer mark W221 with respect to the reference mark W201.

In action S601, a first weighting factor predetermined according to a property of the first layer W210 and a second weighting factor predetermined according to a property of the second layer W220 are obtained. The first weighting factor and the second weighting factor may be obtained by the control unit 270 of the exposure apparatus 200. Each of the first weighting factor and the second weight factor is within a range of 0 to 1. The first weighting factor and the second weighting factor may be the same or different. A sum of the first weighting factor and the second weighting factor equals to 1. For example, the first weighting factor is 0.5; and the second weighting factor is 0.5. Or, the first weighting factor is 0.4; and the second weighting factor is 0.6.

In action S602, an alignment setting of the reticle R230 is calculated according to a first value and a second value. The first value is calculated by the first alignment parameter and the first weighting factor of the first layer W210; and the second value is calculated by the second alignment parameter and the second weighting factor of the second layer W220. Preferably, the first value is a product of the first alignment parameter and the first weighting factor; and the second value is a product of the second alignment parameter and the second weighting factor. The alignment setting of the reticle R230 is a sum of the first value and the second value. In other words, the alignment setting of the reticle R230 is calculated by an equation AS=WF1×AP1+WF2×AP2, where AS is the alignment setting of the third reticle R230, WF1 is the first weighting factor, AP1 is the first alignment parameter, WF2 is the second weighting factor, and AP2 is the second alignment parameter. The alignment setting also includes at least one of an offset, a scaling, and a rotation. The offset of the alignment setting includes a X-offset and a Y-offset. The scaling of the alignment setting includes a X-scaling and a Y-scaling. The rotation of the alignment setting includes a X-rotation and a Y-rotation. By using the Y-offset as an example, the alignment setting of the reticle R230 at Y-offset is calculated by WF1×Dy1+WF2×(−Dy2), where WF1 is the first weighting factor, Dy1 is the first Y-offset of the first alignment parameter, WF2 is the second weighting factor, and Dy2 is the second Y-offset of the second alignment parameter. For example, when WF1 and WF2 are both 0.5, Dy1 is 2, and Dy2 is 3, the alignment setting of the reticle R230 at Y offset is calculated to be −0.5. Similarly, the alignment setting of the reticle R230 for X-offset, X-scaling, Y-scaling, X-rotation, and Y-rotation can be calculated accordingly. The first weighting factor and the second weighting factor respectively indicate the effects of the first layer W210 and the second layer W220 to the patterning of a third layer W230 on the wafer W200. If the first weighting factor is higher than the second weighting factor, it means that compared the second layer W220, the first layer W210 has stronger effect to the patterning of the third layer.

In action S603, the reticle R230 is positioned based on the alignment setting calculated by the first value and the second value to perform the exposure process of a third layer W230 on the wafer W200. Before the exposure process, the third layer W230 coated with a photoresist layer PL is deposited on the second layer W220 of the wafer W200. Then, the wafer W200 is loaded to the exposure apparatus 200 to be exposed with the reticle R230, as shown in FIGS. 5E and 5F. The third reticle R230 is similar to the reticle R200 of FIG. 3. The third reticle R230 includes a third reticle mark R231 configured to form a third layer mark W231 (i.e., the alignment mark on the layer of the wafer) on the third layer W230 of the wafer W200. During the exposure process of the third layer W230 (i.e., the patterning of the third layer W230), the third reticle mark R231 of the third reticle R230 aligns at the alignment setting calculated by the first value and the second value in action S602. FIG. 5F shows a third Y-offset Dy3 which is the distance between the reference Y-position Y0 of the reference mark W201 and a third Y-position Y3 of a third layer mark W231. Accordingly, the method of the present disclosure uses the alignment parameters of at least two previous layers to pattern a next layer. Therefore, the method of the present disclosure can improve the patterning process for multiple layers on the wafer.

According to yet another implementation, the present disclosure also is directed to an exposure apparatus for transferring a pattern of a reticle onto a wafer. The exposure apparatus can be referred to the exposure apparatus 200 of FIG. 2. The exposure apparatus 200 includes an illumination module 220, a reticle stage 230, a projection module 240, a wafer stage 250, and a control unit 270. The illumination module is configured to illuminate the reticle R200 with light from a light source 210. The reticle stage 230 is configured to hold the reticle R200. The projection module 240 is configured to project the pattern of the reticle R200 onto the wafer W200. The wafer stage 250 is configured to position the wafer W200. The control unit 270 is configured to calculate an alignment setting of the reticle R200. The wafer W200 includes a first layer and a second layer disposed on the first layer. The first layer of the wafer W200 includes a first alignment parameter. The second layer of the wafer W200 includes a second alignment parameter. The control unit 270 obtains a first weighting factor predetermined according to a property of the first layer, and a second weighting factor predetermined according to a property of the second layer. The alignment setting of the reticle R200 is calculated according to the first alignment parameter, the first weighting factor, the second alignment parameter, and the second weighting factor. The first alignment parameter of the first layer include at least one of a first offset, a first scaling, and a first rotation. The second alignment parameter of the second layer includes at least one of a second offset, a second scaling, and a second rotation. The first offset of the first alignment parameter includes a first X-offset and a first Y-offset. The first scaling of the first alignment parameter includes a first X-scaling and a first Y-scaling. The first rotation of the first alignment parameter includes a first X-rotation and a first Y-rotation. The second offset of the second alignment parameter includes a second X-offset and a second Y-offset. The second scaling of the second alignment parameter includes a second X-scaling and a second Y-scaling. The second rotation of the second alignment parameter includes a second X-rotation and a second Y-rotation. The exposure apparatus 200 may further include a first driving unit 234 and a second driving unit 254. The first driving unit 234 is coupled to the reticle stage 230 and configured to drive the reticle stage 230. The second driving unit 254 is coupled to the wafer stage 250 and configured to drive the wafer stage 250. The control unit 270 is coupled to the first driving unit 234 and the second driving unit 254 and configured to control a driving pattern of the first driving unit 234 and the second driving unit 254. The exposure apparatus 200 may further include a first interferometer 235 and a second interferometer 255. The first interferometer 235 is configured to measure a position of the reticle stage 230. The second interferometer 255 is configured to measure a position of the wafer stage 250. The exposure apparatus 200 may further include a determination unit 260 configured to determine a feature of the reticle R200.

As described above, the method and the exposure apparatus of the implementations of the present disclosure uses the alignment parameters of at least two previous layers to pattern a next layer. Therefore, the method and the exposure apparatus of the present disclosure can improve the patterning process for multiple layers on the wafer.

The implementations shown and described above are only examples. Many details are often found in the art such as the other features of a method of forming multiple patterned layers on a wafer and an exposure apparatus thereof. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the implementations described above may be modified within the scope of the claims.

What is claimed is:

1. A method of forming multiple patterned layers on a wafer, wherein the wafer has a reference mark for forming a circuit image, the method comprising:
    patterning a first layer of the wafer by exposing a pattern of a first reticle onto the first layer, wherein the first reticle comprises a first reticle mark configured to form a first layer mark on the first layer;
    measuring a first alignment parameter of the first layer mark with respect to the reference mark of the wafer, wherein the first alignment parameter comprises at least one of a first offset, a first scaling, and a first rotation;
    patterning a second layer of the wafer by exposing a pattern of a second reticle onto the second layer, wherein the second reticle comprises a second reticle mark configured to form a second layer mark on the second layer;
    measuring a second alignment parameter of the second layer mark with respect to the reference mark of the wafer, wherein the second alignment parameter comprises at least one of a second offset, a second scaling, and a second rotation;
    obtaining a first weighting factor predetermined according to a property of the first layer, and a second weighting factor predetermined according to a property of the second layer;
    calculating an alignment setting of a third reticle according to a first value and a second value, wherein the first value is calculated by the first alignment parameter and the first weighting factor, and the second value is calculated by the second alignment parameter and the second weighting factor; and
    patterning a third layer of the wafer by exposing the third reticle according to the alignment setting calculated by the first value and the second value;
    wherein during the patterning of the second layer, the second reticle mark of the second reticle aligns with the first layer mark of the first layer.

2. The method of claim 1, wherein each of the first weighting factor and the second weighting factor is within a range of 0 to 1.

3. The method of claim 1, wherein a sum of the first weighting factor and the second weighing factor equals to 1.

4. The method of claim 1, wherein the first value is a product of the first alignment parameter and the first weighting factor.

5. The method of claim 1, wherein the second value is a product of the second alignment parameter and the second weighting factor.

6. The method of claim 1, wherein the alignment setting of the third reticle is a sum of the first value and the second value.

7. The method of claim 1, wherein the third reticle comprises a third reticle mark, during the patterning of the third layer, the third reticle marks of the third reticle aligns at the alignment setting calculated by the first value and the second value.

8. The method of claim 1, wherein the first offset comprises a first X-offset and a first Y-offset, the first scaling comprises a first X-scaling and a first Y-scaling, the first rotation comprises a first X-rotation and a 5 first Y-rotation, the second offset comprises a second X-offset and a second Y-offset, the second scaling comprises a second X-scaling and a second Y-scaling, and the second rotation comprises a second X-rotation and a second Y-rotation.

9. A method of aligning a reticle to a wafer during an exposure process, wherein the wafer comprises a first layer and a second layer, the first layer has a first alignment parameter, the second layer has a second alignment parameter, the method comprising:
    obtaining a first weighting factor predetermined according to a property of the first layer, and a second weighting factor predetermined according to a property of the second layer;
    calculating an alignment setting of the reticle according to a first value and a second value, wherein the first value is calculated by the first alignment parameter and the first weighting factor, and the second value is calculated by the second alignment parameter and the second weighting factor; and
    positioning the reticle based on the alignment setting calculated by the first value and the second value to perform the exposure process of a third layer on the wafer.

10. The method of claim 9, wherein the first alignment parameter comprises at least one of a first offset, a first scaling, and a first rotation, and the second alignment parameter comprises at least one of a second offset, a second scaling, and a second rotation.

11. The method of claim 9, wherein 5 the wafer comprises a reference mark, the first layer comprises a first layer mark, the second layer comprises a second layer mark, the first alignment parameter is defined by the first layer mark of the first layer and the reference mark of the wafer, and the second alignment parameter is defined by the second layer mark of the second layer and the reference mark of the wafer.

12. The method of claim 9, wherein the first value is a product of the first alignment parameter and the first weighting factor, the second value is a product of the second displacement and the second weighting factor, the alignment setting of the reticle is a sum of the first value and the second value.

* * * * *